(12) United States Patent
Gani et al.

(10) Patent No.: US 11,742,437 B2
(45) Date of Patent: Aug. 29, 2023

(54) WLCSP WITH TRANSPARENT SUBSTRATE AND METHOD OF MANUFACTURING THE SAME

(71) Applicants: STMICROELECTRONICS LTD, Kowloon (HK); STMICROELECTRONICS PTE LTD, Singapore (SG)

(72) Inventors: David Gani, Choa Chu Kang (SG); Yiying Kuo, Taoyuan (TW)

(73) Assignees: STMICROELECTRONICS LTD, Kowloon (HK); STMICROELECTRONICS PTE LTD, Singapore (SG)

( * ) Notice: Subject to any disclaimer, the term of this patent is extended or adjusted under 35 U.S.C. 154(b) by 102 days.

(21) Appl. No.: 17/187,510

(22) Filed: Feb. 26, 2021

(65) Prior Publication Data
US 2021/0305438 A1  Sep. 30, 2021

Related U.S. Application Data

(60) Provisional application No. 63/001,004, filed on Mar. 27, 2020.

(51) Int. Cl.
*H01L 31/0203* (2014.01)
*H01L 31/18* (2006.01)
*H01L 31/0392* (2006.01)
*H01L 31/02* (2006.01)
*H01L 21/78* (2006.01)

(52) U.S. Cl.
CPC .......... *H01L 31/0203* (2013.01); *H01L 21/78* (2013.01); *H01L 31/02002* (2013.01); *H01L 31/02005* (2013.01); *H01L 31/0392* (2013.01); *H01L 31/1876* (2013.01); *H01L 31/1896* (2013.01)

(58) Field of Classification Search
CPC .......... H01L 31/0203; H01L 31/02002; H01L 31/02005; H01L 31/0392; H01L 31/1876; H01L 31/1896; H01L 21/78
See application file for complete search history.

(56) References Cited

U.S. PATENT DOCUMENTS

| | | |
|---|---|---|
| 6,271,102 B1 | 8/2001 | Brouillette et al. |
| 6,509,636 B1 | 1/2003 | Tsai et al. |
| 6,777,767 B2 | 8/2004 | Badehi |
| 9,214,592 B2 | 12/2015 | Oganesian |
| 9,282,261 B2 | 3/2016 | Igarashi et al. |

(Continued)

*Primary Examiner* — Sitaramarao S Yechuri
(74) *Attorney, Agent, or Firm* — SEED INTELLECTUAL PROPERTY LAW GROUP LLP

(57) ABSTRACT

The present disclosure is directed to a package, such as a wafer level chip scale package (WLCSP), with a die coupled to a central portion of a transparent substrate. The transparent substrate includes a central portion having and a peripheral portion surrounding the central portion. The package includes a conductive layer coupled to a contact of the die within the package that extends from the transparent substrate to an active surface of the package. The active surface is utilized to mount the package within an electronic device or to a printed circuit board (PCB) accordingly. The package includes a first insulating layer separating the die from the conductive layer, and a second insulating layer on the conductive layer.

20 Claims, 14 Drawing Sheets

(56) References Cited

U.S. PATENT DOCUMENTS

| | | | |
|---|---|---|---|
| 2005/0006732 A1* | 1/2005 | Perillat | H01L 31/02325 257/E31.127 |
| 2009/0004778 A1 | 1/2009 | Lee et al. | |
| 2009/0117680 A1* | 5/2009 | Yamazaki | H01L 21/76254 438/57 |
| 2011/0291215 A1* | 12/2011 | Tu | H01L 27/14625 438/66 |
| 2013/0069252 A1* | 3/2013 | Han | H01L 31/0203 257/E23.116 |
| 2013/0175649 A1* | 7/2013 | Eromaki | H01L 27/1462 257/432 |
| 2014/0312450 A1 | 10/2014 | Tagle et al. | |
| 2016/0306072 A1* | 10/2016 | A Tharumalingam | H01L 24/94 |
| 2017/0141241 A1 | 5/2017 | Yu et al. | |
| 2017/0309771 A1* | 10/2017 | Shen | H01L 31/1876 |
| 2019/0157176 A1* | 5/2019 | Bonnici | H01L 25/18 |
| 2019/0172864 A1* | 6/2019 | Hsu | H01L 24/92 |

* cited by examiner

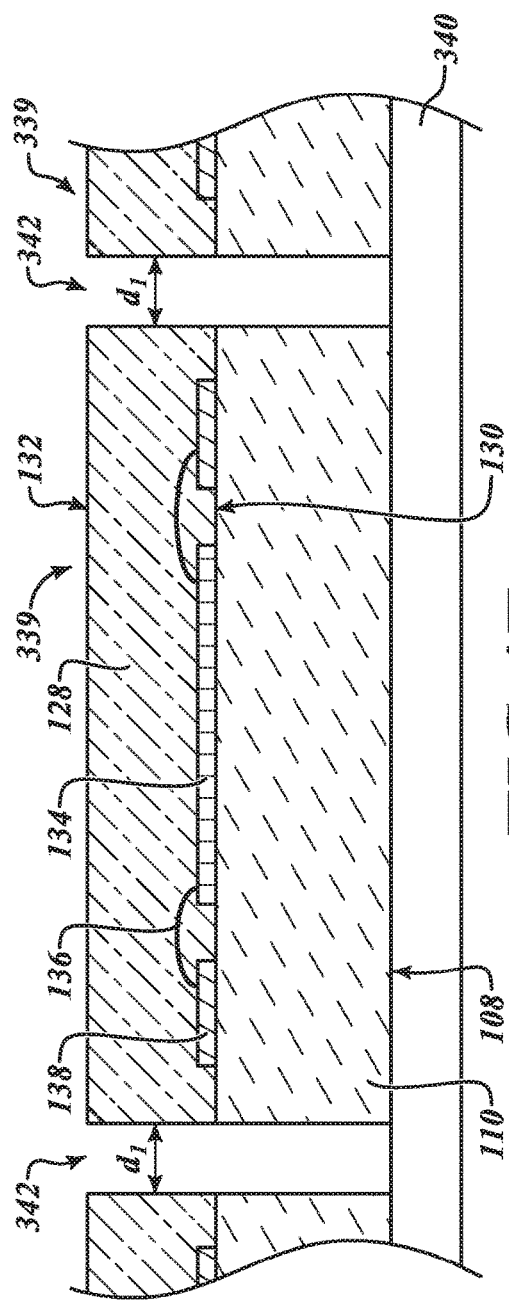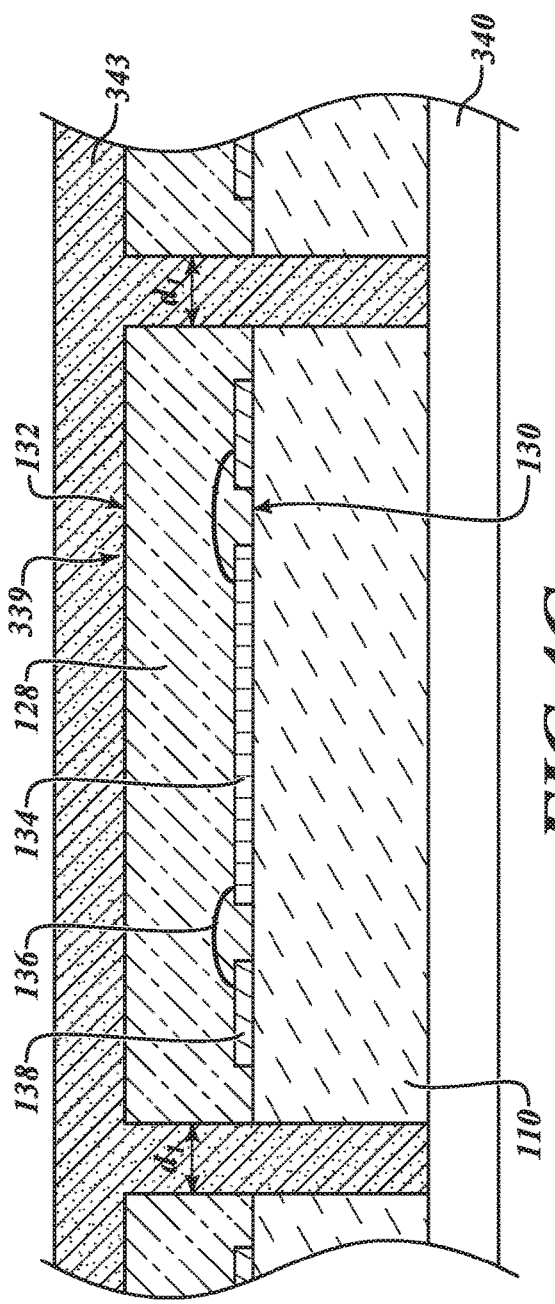

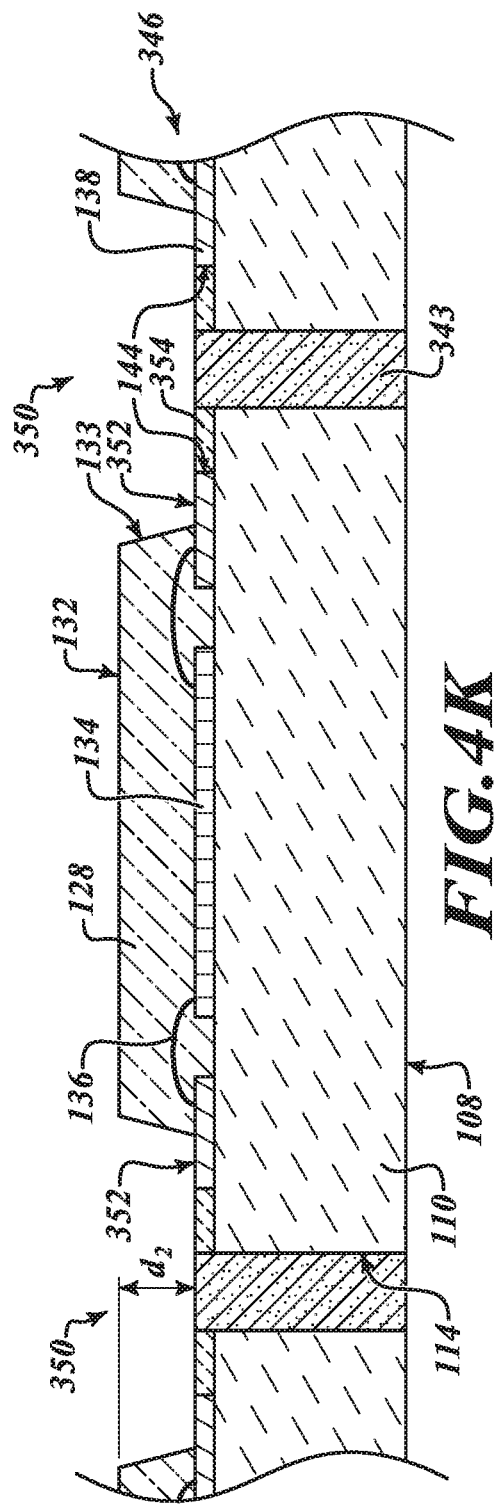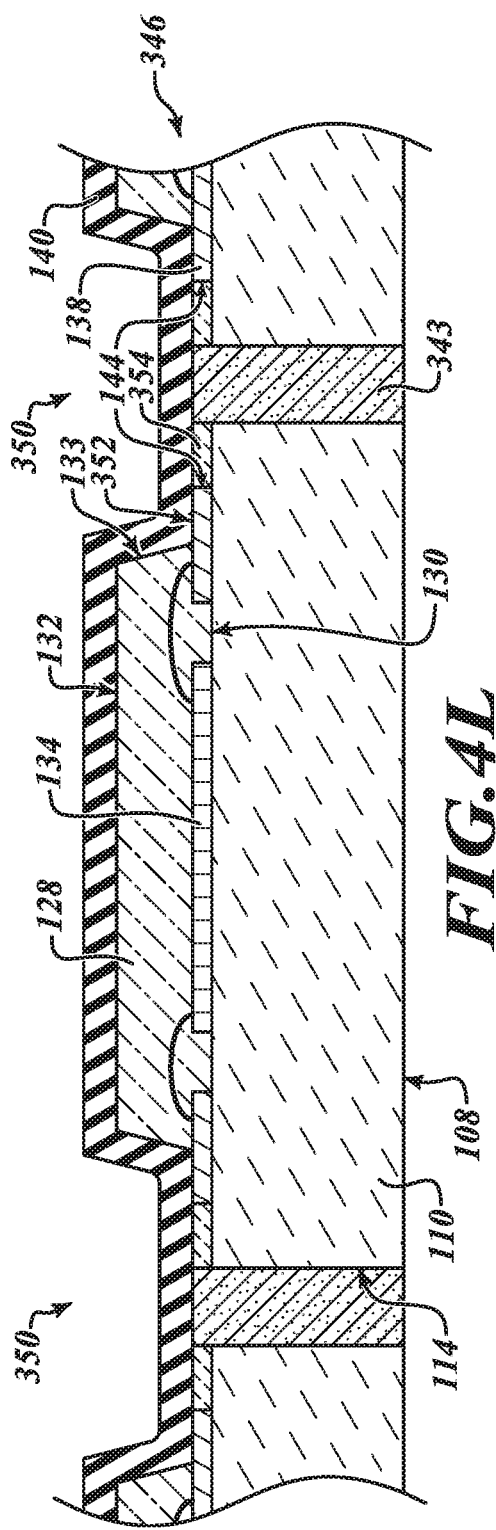

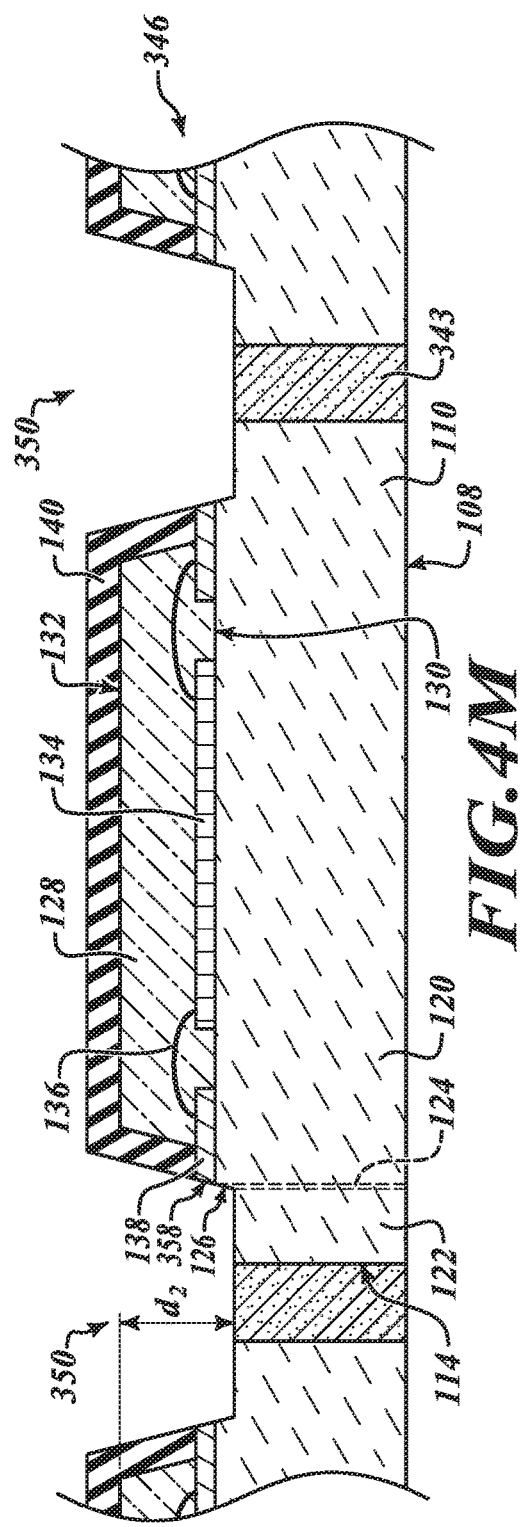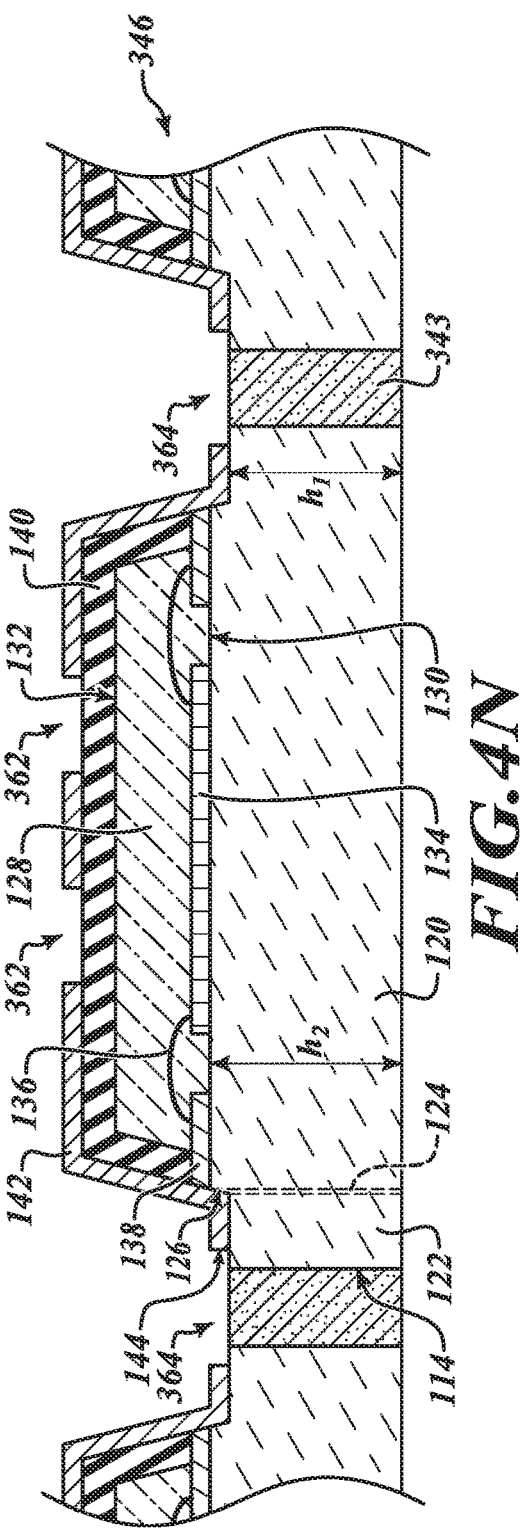

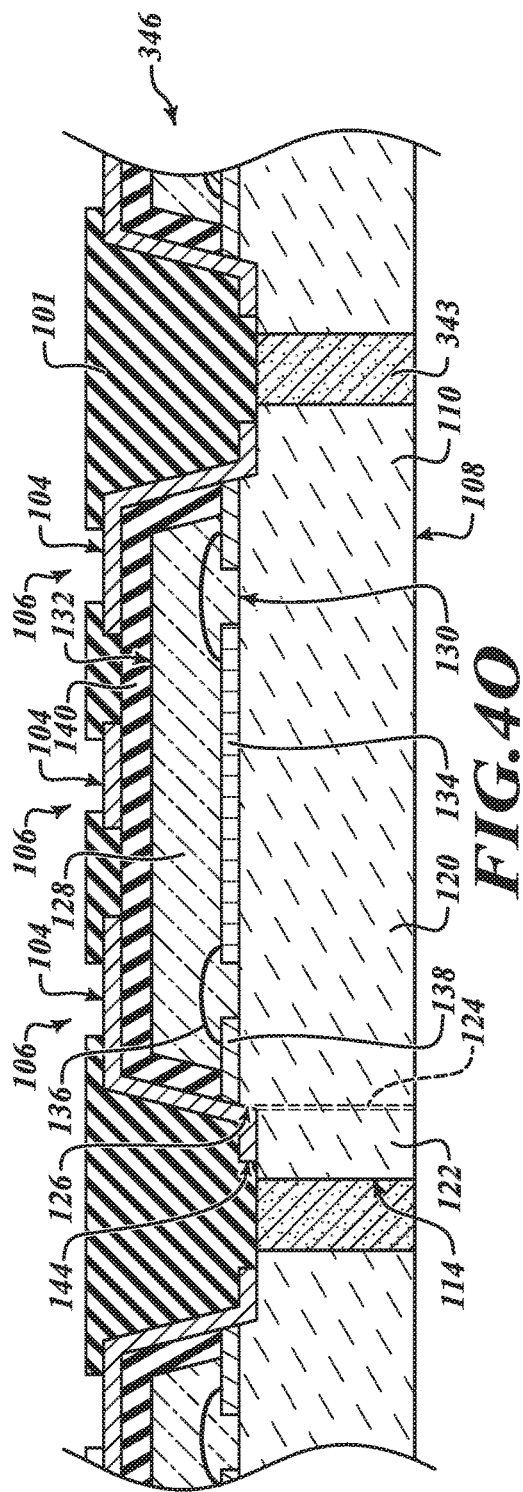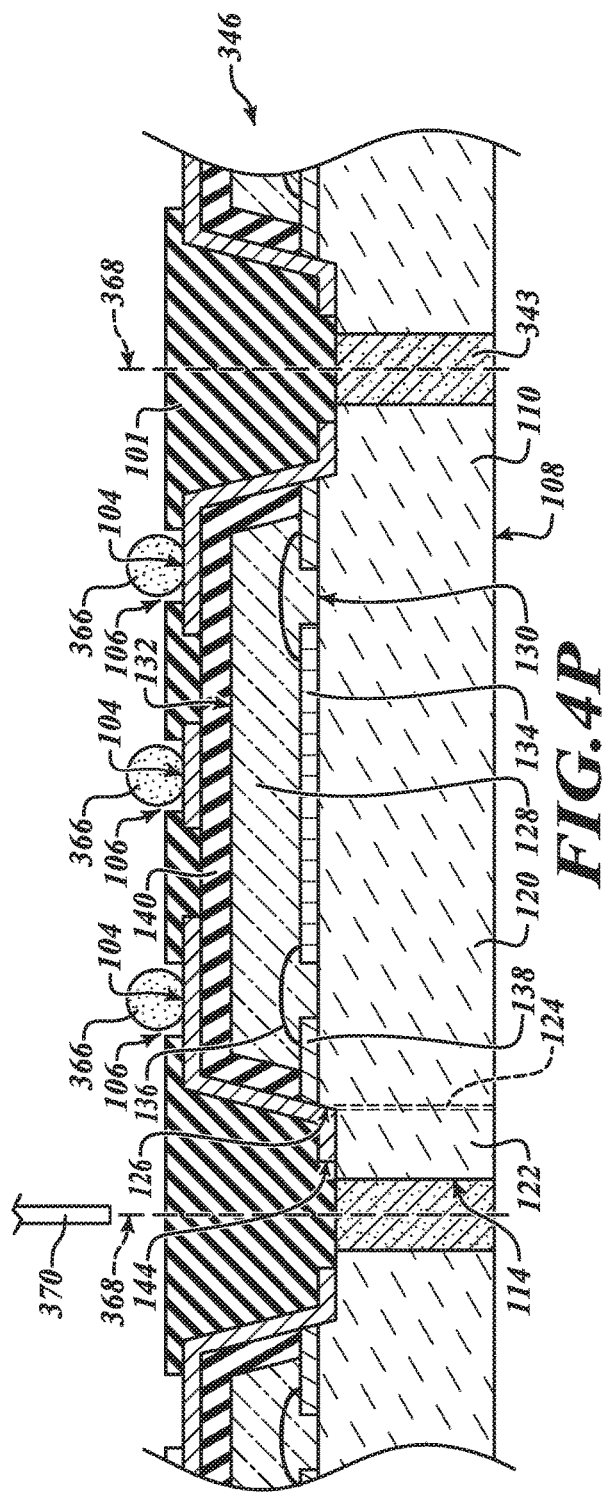

WLCSP WITH TRANSPARENT SUBSTRATE AND METHOD OF MANUFACTURING THE SAME

BACKGROUND

Technical Field

The present disclosure is directed to a package, such as a wafer level chip scale package (WLCSP), and a method of manufacturing the same.

Description of the Related Art

Generally, semiconductor device packages, such as chip scale packages or wafer level chip scale packages (WLCSPs), contain dice, such as sensors configured to detect any number of quantities or qualities of an external environment outside the semiconductor device packages. For example, semiconductor device packages may detect light, temperature, sound, pressure, or any other quantities or qualities of an external environment as desired.

As demand increases to provide a greater number of semiconductor device packages in electronic devices to perform ever increasing complex functions while at the same time reducing costs of manufacturing, increasing resistance to external stresses to reduce likelihood of failure, and increasing the effectiveness of the semiconductor device packages, there are significant challenges to balance all of the above preferences. Examples of electronic devices include laptops, displays, televisions, smart phones, tablets, foldable electronics, or any other electronic device.

BRIEF SUMMARY

Embodiments of the present disclosure overcome significant challenges associated with packages such as wafer level chip scale packages (WLCSPs), such as increasing effectiveness and robustness of light sensors within the WLCSPs.

One significant challenge is to reduce the amount of light that escapes from a transparent substrate when the WLCSP is configured as a light sensor. For example, depending on the configuration of the layers and components of a light sensor (e.g., glass lens aligned with a light sensor) light entering the WLCSP or package from an external environment emitted by an external light source may be able to escape from the WLCSP or package before reaching the light sensor altogether.

In the present disclosure, an embodiment of a WLCSP configured to detect light includes a transparent substrate, a die, a light sensor in the die, a first insulating layer on the die, a conductive layer on the first insulating layer, a second insulating layer on the conductive layer, and a molding compound layer on sidewalls of the transparent substrate. The molding compound layer is formed of an opaque material that is on the sidewalls of the transparent substrate. This reduces the amount of light that escapes from the sidewalls of the transparent substrate and increases the amount of light that reaches the light sensor of the die. Accordingly, it is desired for the opaque molding compound layer to be on the sidewalls of the transparent substrate to increase the light reaching the light sensor of the die.

Another significant challenge is manufacturing WLCSPs with the least amount of highly specialized machinery and the least amount of waste to reduce costs of manufacturing the WLCSPs, as well as increasing the yield of useable WLCSPs with a transparent substrate.

In an embodiment of a method of manufacturing WLCSPs, a 12-inch semiconductor wafer is converted into an 8-inch wafer. A transparent wafer is coupled to the 12-inch semiconductor wafer, which may include active and passive components. The transparent wafer and the 12-inch semiconductor wafer are singulated to form a plurality of substrate assemblies, each including a semiconductor substrate and a transparent substrate affixed to each other. The plurality of substrate assemblies are coupled to a carrier substrate (e.g., glass, silicon, etc.). A molding compound is then formed on the plurality of substrate assemblies to form an 8-inch wafer, which is then further processed by highly specialized machinery to form a plurality of WLCSPs. Accordingly, by converting the 12-inch wafer to the 8-inch wafer through the above process, machinery capable of only utilizing 8-inch wafers may be utilized, and no duplicates of any highly specialized machinery is required to be utilized in manufacturing the WLCSPs by converting 12-inch wafers into 8-inch wafers.

In this embodiment of the method of manufacturing WLCSPs, the molding compound, which preferably is opaque, is formed on and covers the sidewalls of the substrate assemblies on the carrier support. The molding compound fills spaces or channels between the substrate assemblies, which are coupled to the carrier substrate. A plurality of trenches is formed in the molding compound and the plurality of semiconductor dies. In the plurality of trenches and on the plurality of substrate assemblies various layers (e.g., insulating layers, passivation layers, transparent substrate, conductive layers, and other various layers of material) of material are formed. After the various layers are formed, the 8-inch wafer is singulated to form the WLCSP. The wafer is singulated at locations between the plurality of transparent substrates where the molding compound is present. By singulating the wafer at these locations, the likelihood of cracking or breaking the transparent substrates is significantly reduced as the transparent substrate are not singulated multiple times. In addition, by leaving some of the molding compound behind during this singulation step, the molding compound layers on the sidewalls of the transparent substrates are formed in completed packages. Accordingly, this embodiment of the method of manufacturing these WLCSPs reduces the cost to manufacturing as the yield of useable WLCSPs is increased.

Yet another significant challenge is reducing a thickness of a WLCSP while maintaining the WLCSP's function. For example, as electronic devices become thinner and more articulable (e.g., foldable displays or device, bendable displays or devices, etc.) and interactive (e.g., touch screens, haptic feedback, etc.) the space to provide semiconductor die within the electronic device significantly reduces. It is desired to have the WLCSP to be thin so the WLCSP can be incorporated into the small space available within an electronic device to provide the information for the electronic device to function as desired.

In this embodiment of the method of manufacturing WLCSPs, the 12-inch semiconductor wafer, which includes active and passive components, is coupled to the transparent wafer. The transparent wafer may be coupled to the 12-inch semiconductor wafer using a transparent die attach film, a transparent glue, or an alternative transparent die attach material that allows light to pass through. By coupling the 12-inch semiconductor wafer to the transparent wafer at the beginning of the process, no caps or lenses are needed to be applied to the WLCSP to allow for light to reach the light sensor, which reduces the overall thickness of the completed WLCSP. Accordingly, this embodiment of the method of manufacturing these WLCSPs reduces the overall thickness of the completed WLCSPs.

BRIEF DESCRIPTION OF THE SEVERAL VIEWS OF THE DRAWINGS

In the drawings, identical reference numbers identify similar elements or acts unless the context indicates otherwise. The sizes and relative portions of the elements in the drawings are not necessarily drawn to scale.

DETAILED DESCRIPTION

Figure 1A:
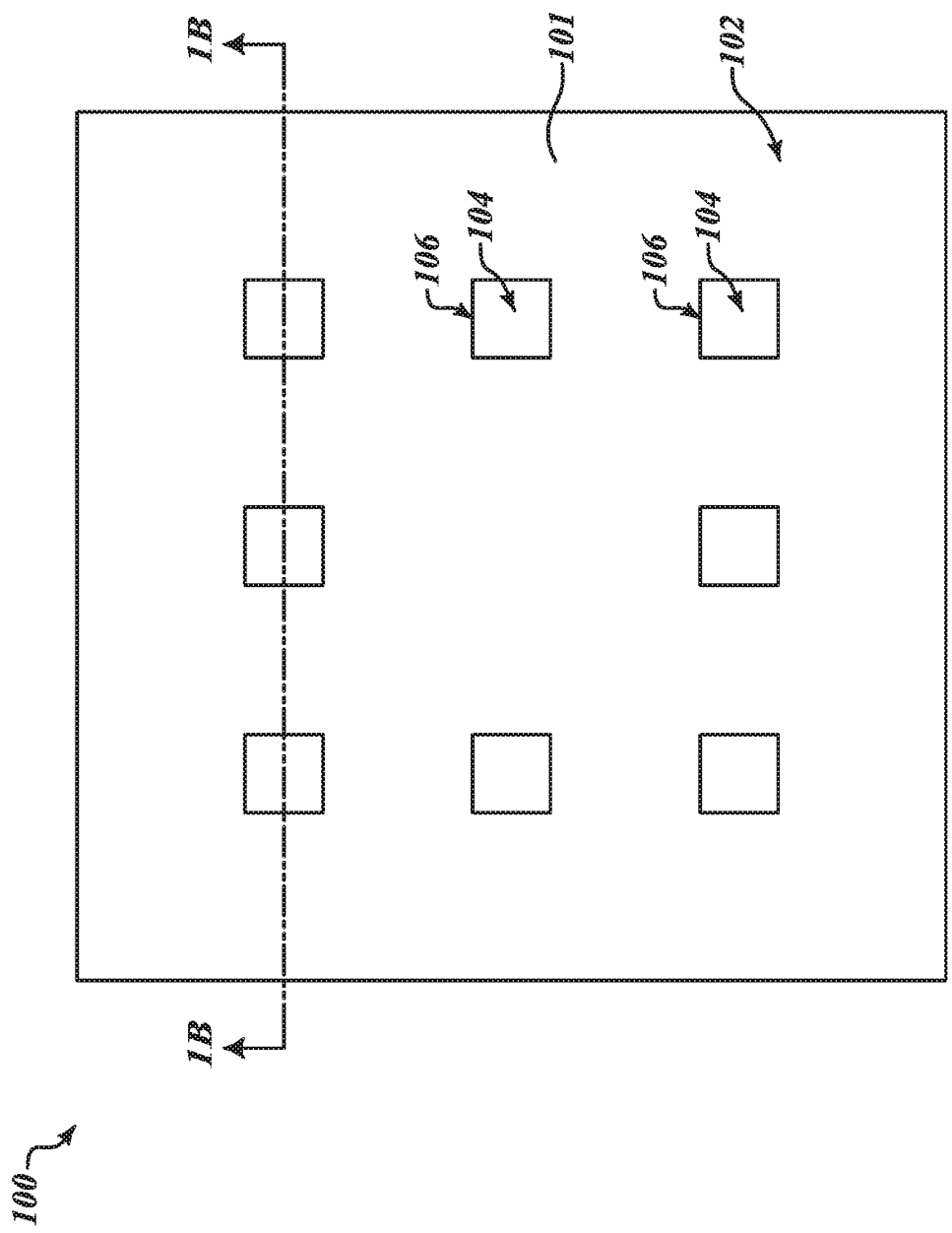
FIG. 1A is a top-plan view of one embodiment of a wafer level chip scale package (WLCSP) including a die with a light sensor and a transparent substrate aligned with the light sensor of the die.

In the following description, certain specific details are set forth in order to provide a thorough understanding of various embodiments of the disclosure. However, one skilled in the art will understand that the disclosure may be practiced without these specific details. In other instances, well-known structures associated with electronic components and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The term "left," "right," "top," and "bottom" are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The term "substantially" is used to clarify that there may be slight differences when a WLCSP is manufactured in the real world, as nothing can be made perfectly equal or perfectly the same. This term is not limiting as this term is only to clarify real world manufacturing of a WLCSP. In other words, substantially means that there may be some slight variation in actual practice as nothing can be made perfect, but instead is made within accepted tolerances.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The present disclosure is directed to various embodiments of semiconductor device packages, such as wafer level chip scale packages (WLCSPs), that each include a semiconductor die and a transparent substrate. The transparent substrate is aligned with a sensor of the die and is configured to expose the sensor of the die to light from an external light source. In some other embodiments, the die may include an LED or a light source that is aligned with the transparent substrate to emit light through the transparent substrate.

In some embodiments, the transparent substrate includes a central portion with a first height and a peripheral portion with a second height that surrounds the central portion. The first height of the central portion is greater than the second height of the peripheral portion that surrounds the central portion. The peripheral portion has sidewalls that are covered by a molding compound layer. The molding compound layer surrounds and forms a boundary around the transparent substrate. The molding compound is an opaque material configured to increase the amount of light that reaches the sensor of the die by reducing the amount of light that escapes from the sidewalls of the transparent substrate as the light passes through the transparent substrate to reach the sensor. The molding compound also protects the transparent substrate of the package during the manufacturing process during the singulation process because the molding compound is cut instead of the transparent substrate. The die is on the central portion of the transparent substrate and the sensor is aligned with the central portion of the transparent substrate.

While various embodiments are shown and described with respect to WLCSPs, it will be readily appreciated that embodiments of the present disclosure are not limited thereto. In various embodiments, the structures, devices, methods, and the like described herein may be embodied in or otherwise utilized in any suitable type or form of semiconductor packages or WLCSPs, and may be manufactured utilizing any suitable semiconductor packaging technologies as desired.

FIG. 1A is a top-plan view of an embodiment of a package 100, such as a WLCSP. The package 100 includes an insulating layer 101, having a first surface 102, and a plurality of conductive contacts 104 that are exposed by openings 106 in the first surface 102. The insulating layer may be a passivation layer, a molding compound layer, an epoxy layer, or some other insulating material. The first surface 102 may be referred to as an active or mounting surface of the package 100 because the plurality of conductive contacts 104 is configured to be mounted to a printed circuit board (PCB) or within an electronic device by a conductive material. The contacts 104 are coupled to active and passive components within the package 100, which will be discussed in more detail with respect to FIG. 1B as follows.

Figure 1B:
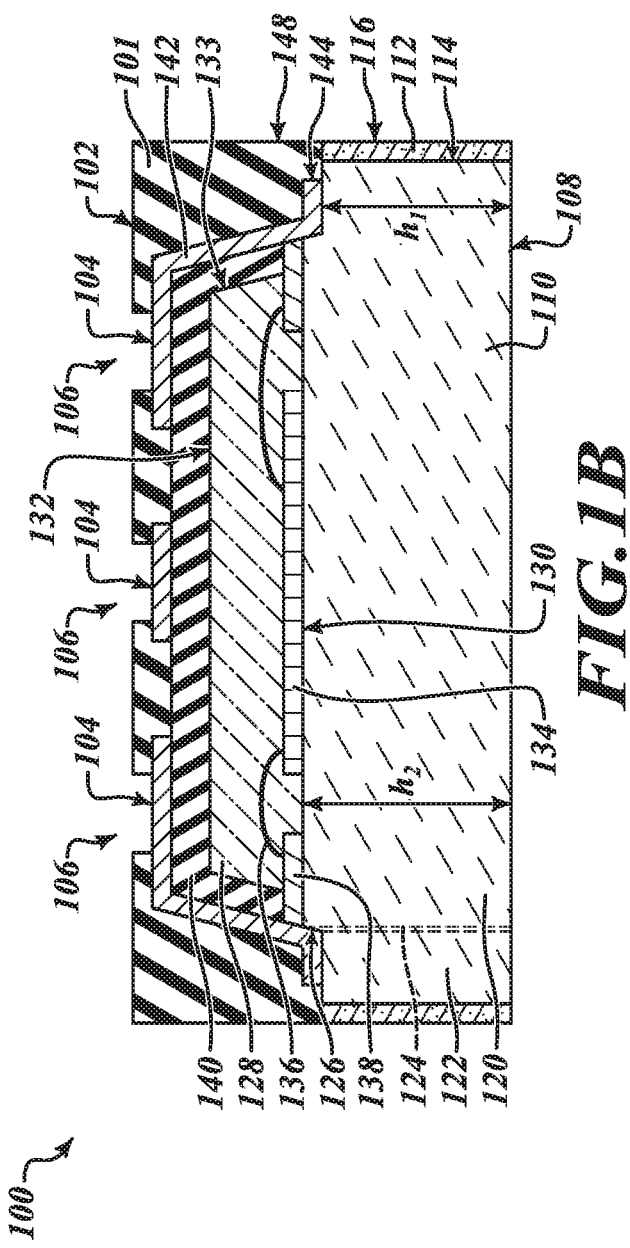
FIG. 1B is a cross-sectional view of the one embodiment of the WLCSP taken along line 1B-1B in FIG. 1A.
Figure 1C:
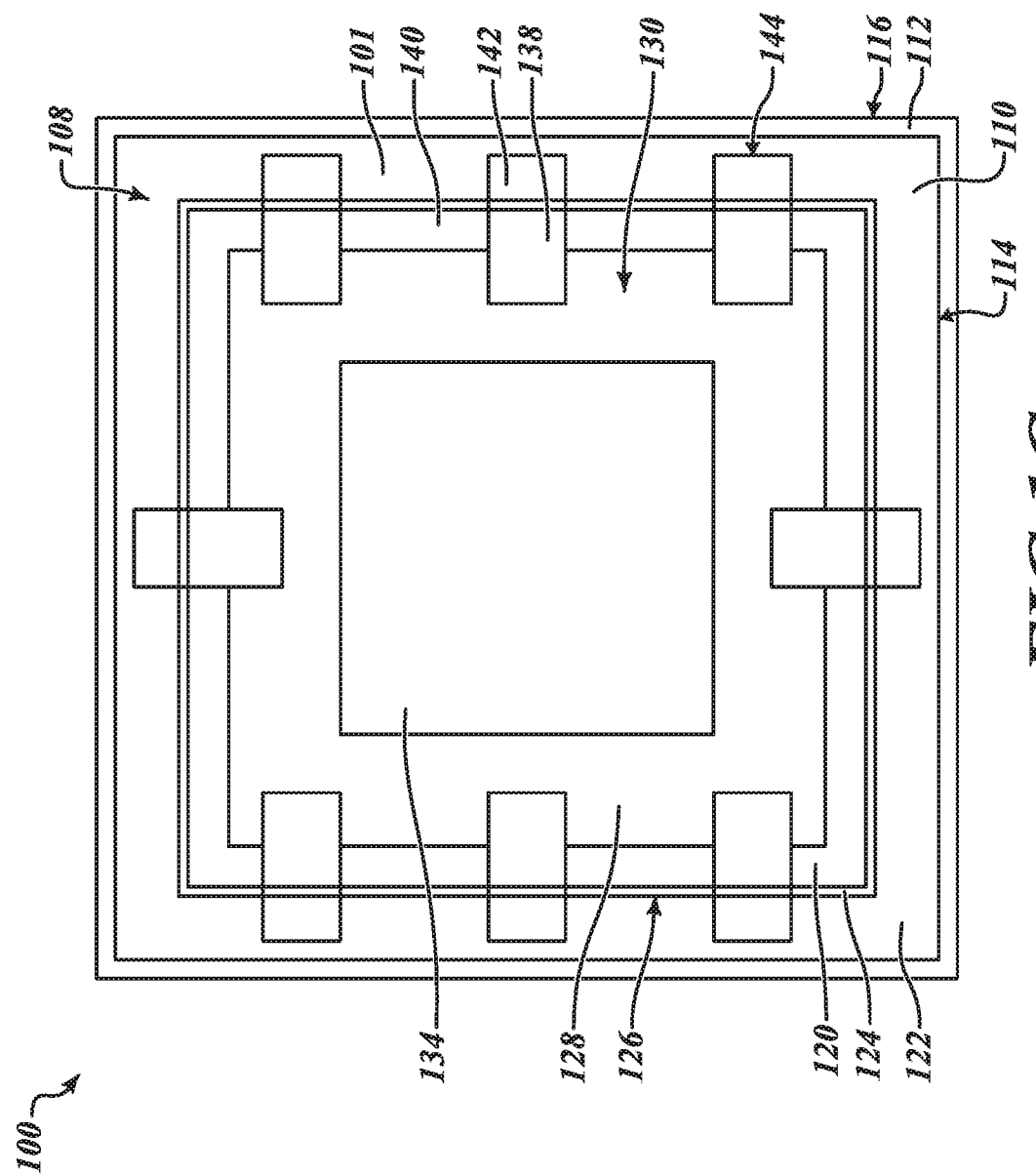
FIG. 1C is a bottom-plan view of the one embodiment of the WLCSP in FIGS. 1A and 1B.

FIG. 1B is a cross-sectional side view of the package 100 taken along line 1B-1B in FIG. 1A and FIG. 1C is a bottom-plan view of the package 100 in FIGS. 1A and 1B. The line 1B-1B passes through three of the contacts 104 of the package 100.

The package 100 includes a second surface 108 opposite to the first surface 102. The second surface 108 may be referred to as a passive surface as the second surface 108 does not include any active or passive conductive components. Instead, the second surface 108 includes a surface of a transparent substrate 110 and a surface of a molding compound layer 112. The transparent substrate 110 may be a glass material, an acrylic material, a plastic material, or any other transparent material or combination of transparent materials that allow light to pass through and have a high transmittance. Alternatively, the transparent substrate 110 may be multiple layers of material stacked to increase the transmittance of light through the multiple layers. The surface of the transparent substrate 110 and the surface of the molding compound layer 112 are substantially flush or co-planar.

The surface of the transparent substrate 110, which is part of the second surface 108 of the package 100, is uncovered. The molding compound layer 112 is on sidewalls 114 of the transparent substrate 110. The sidewalls 114 of the transparent substrate 110 have a first height $h_1$. The molding compound layer 112 has sidewalls 116 that have the first height $h_1$. The molding compound layer 112 preferably is an opaque material, such as a molding compound including a black carbon pigment, a plastic molding compound made of an opaque material, or some other opaque material or combination of opaque materials that do not allow light to pass through them. Using an opaque material enables the molding compound layer 112 prevent light escaping from the sidewalls 114 of the transparent substrate 110 after the light has entered through the uncovered surface of the transparent substrate 110, which will be discussed in greater detail later within the present disclosure.

The transparent substrate 110 includes a central portion 120 having a second height $h_2$, which is greater than the first height $h_1$ of the sidewalls 114 of the transparent substrate 110 and the sidewalls 116 of the molding compound layer 112. The transparent substrate 110 further includes a peripheral portion 122 that surrounds the central portion 120 and forms a boundary or perimeter around the central portion 120. The peripheral portion 122 has the first height $h_1$ of the sidewalls 114 of the transparent substrate 110.

The transparent substrate 110 includes a connecting portion 124, having an inclined surface 126 that couples the peripheral portion 122 to the central portion 122. The central portion 120, the peripheral portion 122, and the connecting portion 124 are made of a contiguous material of the transparent substrate 110. The incline of the inclined surface 126 is defined by the difference in height between the first height $h_1$ of the peripheral portion 122 and the second height $h_2$ of the central portion. In some other embodiments, the first height $h_1$ may be greater than the second height $h_2$ or the first height $h_1$ may be substantially the same as the second height $h_2$.

A semiconductor die 128 is coupled to the central portion 120 of the transparent substrate 110. The die is coupled to the central portion 120 of the transparent substrate 110 by an adhesive (which is not shown). The adhesive may be a glue, a die attach film (DAF), or some other adhesive material or combination of adhesive materials. The semiconductor die 128 is opposite to the second surface 108 of the package 100. The semiconductor die 128 includes active and passive components to perform desired functions. For example, the semiconductor die 128 may include components configured to detect light, pressure, sound, temperature, humidity, or any other quality or quantity of an external environment.

The semiconductor die 128 includes an active surface 130 and a passive surface 132 opposite to the active surface 130. The active surface 130 is on the central portion 120 of the transparent substrate 110 and faces toward the transparent substrate 110. The passive surface 132 is opposite to the active surface 130 and faces away from the transparent substrate 110 and the active surface 130 of the semiconductor die 128. The passive surface 132 does not include any active or passive components whereas the active surface 130 includes active and conductive components. An inclined surface 133 of the semiconductor die 128 extends between the active surface 130 and the passive surface 132 of the semiconductor die 128.

The semiconductor die 128 includes a sensor 134 at the active surface 130 of the semiconductor die 128. The sensor 134 may be a light sensor, such as an image sensor, a single photon avalanche diode (SPAD), or some other type of light sensor or combination of light sensors as desired. The sensor 134 may be configured to detect infrared light, ultraviolet light, visible light, or any wavelength of light as desired. The light sensor 134 may be an array of sensors or a plurality of sensors that are positioned on the active surface 130 of the semiconductor die 128. In some other alternative embodiments, the sensor 134 may be another type of sensor, such as a sensor configured to detect pressure, sound, temperature, humidity, or any other quality or quantity of an external environment. The light sensor 134 may be positioned at a center of the active surface 130 of the semiconductor die 128.

An electrical connection 136 has a first end coupled to the light sensor 134 and a second end coupled to a contact 138 on a surface of the semiconductor die 128. The electrical connection 136 may be configured to communicate signals to/from the contact 138 from/to the light sensor 134 as desired. The electrical connection 136 may include a conductive material, such as a copper or doped semiconductor, extending through or on a surface of the semiconductor die 128. The electrical connection 136 may also include various circuitry, such as transistors, diodes, or other conductive elements.

The contact 138 is a conductive material such as a copper material, a gold material, an aluminum material, an alloy material, or any other conductive material or combination of conductive materials as desired. The contact 138 extends outward from an edge of the semiconductor die 128 and away from the light sensor 134 of the semiconductor die 128. The contact 138 extends across the central portion 120 of the transparent substrate 110 to an edge of the transparent substrate 110 where the central portion 120 meets the connecting portion 124.

Another insulating layer 140 is on the passive surface 132 and the inclined surface 133 of the die. The insulating layer 140 is also on the contact 138. The insulating layer 140 may be of any electrically insulating material, such as an epoxy material, a plastic material, a passivation material, a repassivation material, a dielectric material, or some other insulating material or combination of insulating materials as desired. The insulating layer 140 is configured to separate the semiconductor die 128 from a conductive layer 142 to avoid the conductive layer 142 coming into contact with the semiconductor die 128.

The conductive layer 142 is on the insulating layer 140, the contact 138 of the semiconductor die 128, and the peripheral and the connecting portions 122, 124 of the transparent substrate 110. The conductive layer 142 is in contact with a sidewall of the contact 138 of the semiconductor die 128. The conductive layer 142 allows for signals to be communicated to and from the contact 138 of the die to and from an external device. For example, the external device may be a controller, an electronic device, a memory, or some other component of an electronic device configured to control or utilize the package 100 to perform a desired function. The conductive layer 142 includes a first end 144 on the peripheral portion 122 of the transparent substrate 110. In this embodiment, the first end 144 is positioned between the sidewalls 114 of the transparent substrate 110 and the connecting portion 124 of the transparent substrate 110. However, in other alternative embodiments, the first end 144 may be positioned on the connecting portion 124 or may extend to the sidewalls 114 of the transparent substrate 110. The conductive layer 142 may be referred to as an electrical connection, a redistribution layer (RDL), or some other conductive connection or combination of conductive connections as desired. In an alternative embodiment the conductive layer may be a conductive via.

The insulating layer 101 is on the conductive layer 142, the molding compound layer 112, the insulating layer 140, and the peripheral portion 122 and the connecting portion 124 of the transparent substrate 110. The insulating layer 101 is configured to protect the conductive layer 142 from external conductive material to avoid short circuiting or undesired electrical connections between the conductive layer 142 and external electrical components on a PCB or within an electronic device. The insulating layer 101 covers the first end 144 of the conductive layer 142. The insulating layer 101 includes sidewalls 148. The sidewalls 148 of the insulating layer 101 are substantially flush or co-planar with the sidewalls 116 of the molding compound layer 112. The insulating layer 101 includes the openings 106 that expose contacts 104. The contacts 104 are portions of the conductive layer 142 exposed by the openings 106 in the insulating layer 101. The openings 106 are shown as having square shapes, however, in alternative embodiments, the openings may have circular shapes, rectangular shapes, or any other shape as desired. The insulating layer 101 may be of any insulating material, such as an epoxy material, a plastic material, a passivation material, a repassivation material, a dielectric material, or some other insulating material or combination of insulating materials. The insulating layer 101 may be referred to as a protective layer.

In this embodiment, the dimensions of the package 100 are as follows. The transparent substrate 110 has a thickness of about 100-500 micrometers, the die has a thickness of 50-200 micrometers, the conductive layer 142 has a thickness of 3-5 micrometers, and the insulating layer 140 has a thickness of 10-30 micrometers. While these are the thicknesses of various components of the package 100 in this embodiment, these components are not exactly to scale in FIG. 1B for clarity purposes. Although in this embodiment the above dimensions may be as listed out above, in some other alternative embodiments of a WLCSP, the WLCSP may have different dimensions entirely from those set forth above.

FIG. 1C is a top-plan view of the embodiment of the package 100 as seen in FIGS. 1A and 1B. As discussed earlier, the package 100 includes the transparent substrate 110. The transparent substrate 110 includes the central portion 120, the peripheral portion 122, and the connecting portion 124. The connecting portion 124 extends between the central portion 120 and the peripheral portion 122 and couples the central portion 120 to the peripheral portion 122. In addition, as discussed earlier with respect to FIG. 1B, the peripheral portion 122 surrounds and forms a perimeter or boundary around both the central portion 120 and the connecting portion 124. Similarly, the connecting portion 124 surrounds and forms a perimeter or boundary around the central portion 120. The relation of these various portions of the transparent substrate 110 can clearly be seen in FIG. 1C. Additionally, as discussed earlier with respect to FIG. 1B, the semiconductor die 128 is on the central portion 120 of the transparent substrate 110 and the sensor 134 is aligned with the central portion 120 of the transparent substrate 110, which can clearly be seen in FIG. 1C.

Figure 2:
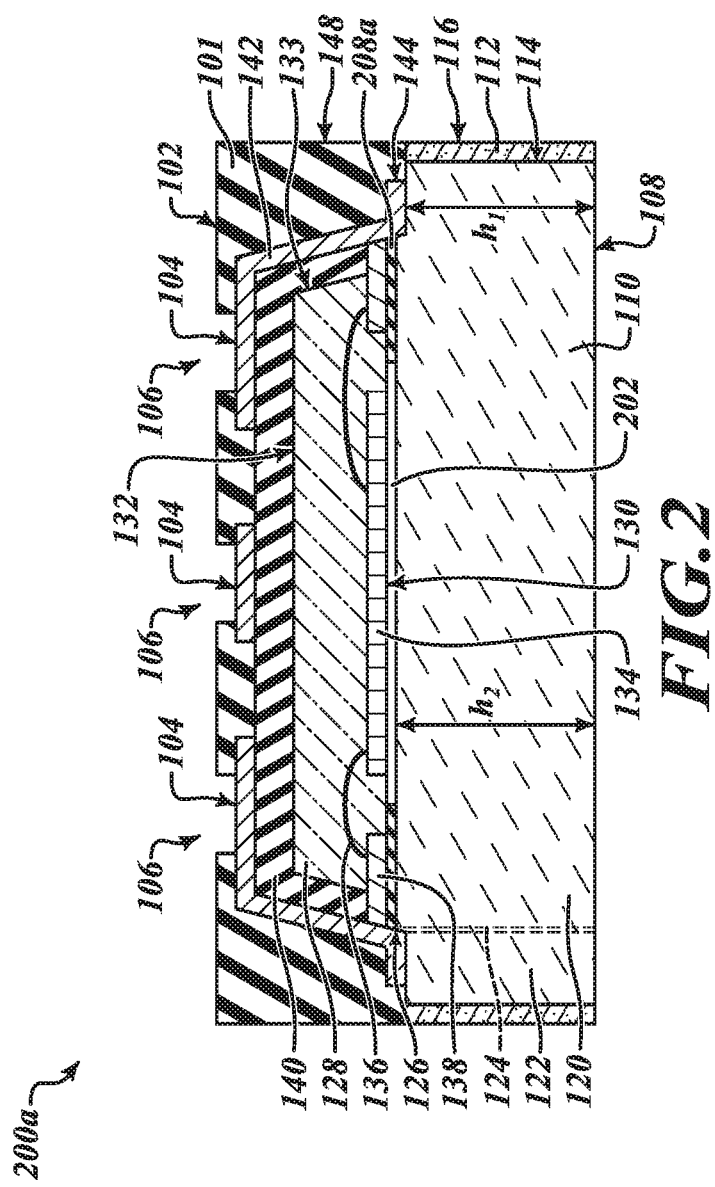
FIG. 2 is a cross-sectional view of an alternative embodiment of a WLCSP taken along a line similar to line 1B-1B in FIG. 1A.

FIG. 2 is a cross-sectional view of an alternative embodiment of a package 200a. The package 200a may be a WLCSP or a semiconductor package. This cross-sectional view of the package 200a is taken along a similar line as 1B-1B in FIG. 1A of package 100. The package 200a has similar features to the embodiment in the package 100 illustrated in FIG. 1B, which are represented by the same reference numerals as in FIG. 1B.

However, in this alternative embodiment, the package 200a includes a cavity 202. The cavity 202 is aligned with the central portion 120 of the transparent substrate 110. The cavity 202 is adjacent to and aligned with the light sensor 134 of the semiconductor die 128. The cavity 202 spaces apart the central portion 120 of the transparent substrate 110 from the light sensor 134. The cavity is formed in a layer of material 208a between the semiconductor die 128 and the transparent substrate 110. In this alternative embodiment, the layer of material 208a is coupling the semiconductor die 128 to the transparent substrate 110. The layer of material 208a may be an insulating material, a non-conductive material, an adhesive material, or any insulating or combination of insulating materials as desired. Alternatively, in some other embodiments of a package, the cavity 202 may be formed by multiple layers of material instead of the layer of material 208a. In other alternative embodiments, the cavity 202 may be within or extend into the central portion 120 of the transparent substrate 110. If the cavity 202 is within the central portion 120 of the transparent substrate 110, the second height $h_2$ may be less than the first height $h_1$ or the second height $h_2$ may be substantially the same as the first height $h_1$. For example, if the cavity 202 extends far enough within the transparent substrate 110 toward the surface 108, then the central portion 120 of the transparent substrate 110 will have the second height $h_2$ that is less than the first height $h_1$ of the peripheral portion 122.

The cavity 202 in the package 200a has a thickness substantially equal to a thickness of the layer of material 208a. In some other embodiments, the cavity may have a thickness that is greater than a thickness of the layer of material 208a or a thickness that is less than the layer of material 208a. In other words, the cavity 202 may have any dimensions as desired.

In some of the embodiments of a package, the light sensor 134 may extend into the cavity 202. The cavity may be wide enough and deep enough for the sensor to completely fit in the cavity or for the sensor to partially fit within the cavity.

Figure 3:
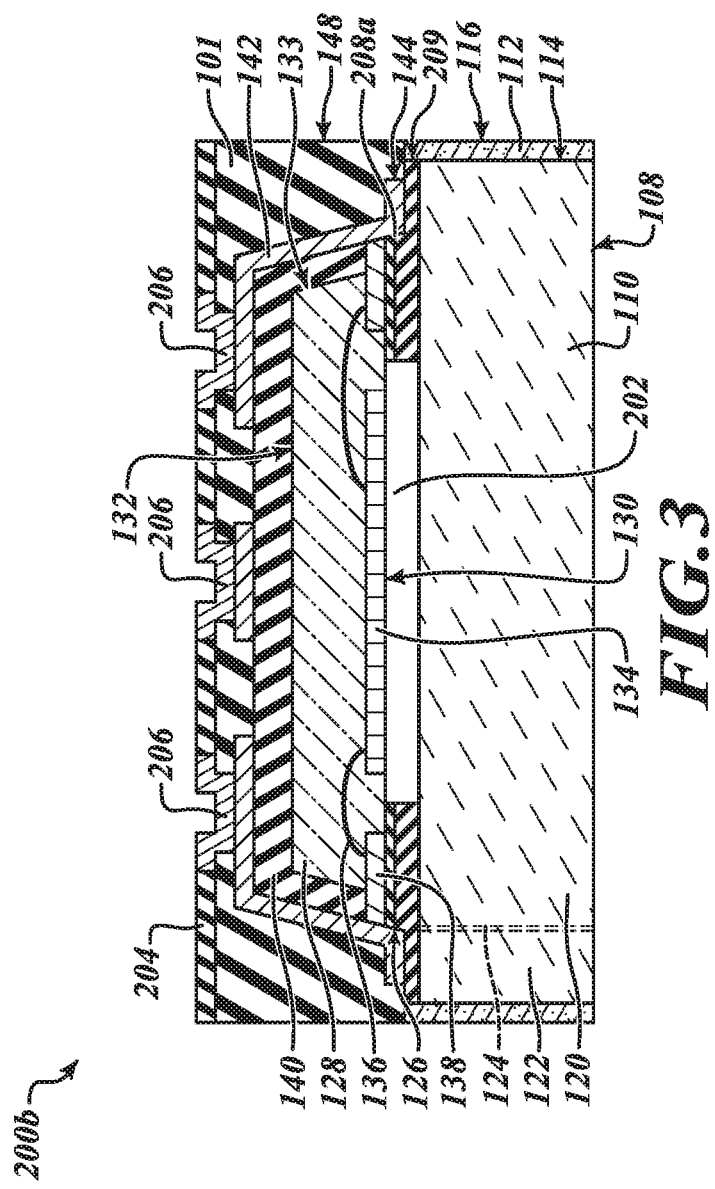
FIG. 3 is a cross-sectional view of an alternative embodiment of a WLCSP taken along a line similar to line 1B-1B in FIG. 1A.

FIG. 3 is a cross-sectional view of an alternative embodiment of a package 200b, which is similar to the package 200a in FIG. 2. The package 200b has similar features to the embodiments in the packages 100, 200a in FIGS. 1B and 2, which are represented by the same reference numerals as in FIGS. 1B and 2.

However, in this alternative embodiment, the package 200b includes multiple layers of material 208b between the semiconductor die 128 and the transparent substrate 110. The multiple layers of material 208b may be multiple layers of insulating material, non-conductive materials, multiple layers of adhesive materials, or multiple layers of any insulating materials as desired. In this alternative embodiment, the multiple layers of material 208b are coupling the semiconductor die to the transparent substrate 110. Unlike the package 200a in FIG. 2, the package 200b includes a portion of the multiple layers of material 208b between the transparent substrate 110 and the conductive layer 142, and an end 209 of the multiple layers of material 208b has a surface that is covered by the molding compound layer 112. The portion of the multiple layers of material 208b separates the conductive layer 142 from the transparent substrate 110. Unlike the package 200a, the package 200b has the transparent substrate 110, however, the transparent substrate 110 has a height that is substantially the same along a length of the transparent substrate 100 that extends between sidewalls 114 of the transparent substrate 110.

Alternatively, in some other embodiments of a package, the cavity 202 may be formed by a single layer of material instead of multiple layers of material 208b, and the end 209 may be covered by the insulating layer 101. In other alternative embodiments, the cavity 202 may be within or extend into the central portion 120 of the transparent substrate.

The cavity 202 in the package 200b has a thickness substantially equal to a thickness of the multiple layers of material 208b. In some other embodiments, the cavity may have a thickness that is greater than a thickness of the multiple layers of material 208b or a thickness that is less than the multiple layers of material 208b. In other words, the cavity 202 may have any dimensions as desired.

The package 200b includes an insulating layer 204 formed on the insulating layer 101 and under bump metallizations (UBMs) 206 in the insulating layers 101, 204. The insulating layer 204 may be an epoxy material, a plastic material, a passivation material, a repassivation material, or some other insulating material or combination of insulating materials. As shown in FIG. 2, the UBMs 206 each include a recess extending toward the semiconductor die 128 to enable better contact with solder bumps (discussed below) that are used to electrically connect the package 200a to a PCB or other device.

In some other alternative embodiments of a WLCSP, the UBMs 206 may have a different shape or configuration. For example, the UBMs 206 may extend outward from the insulating layer 204 or the UBMs 206 may be on the insulating layer 204. Accordingly, the UBMs 206 may have any shape or configuration as desired.

Figure 4A:
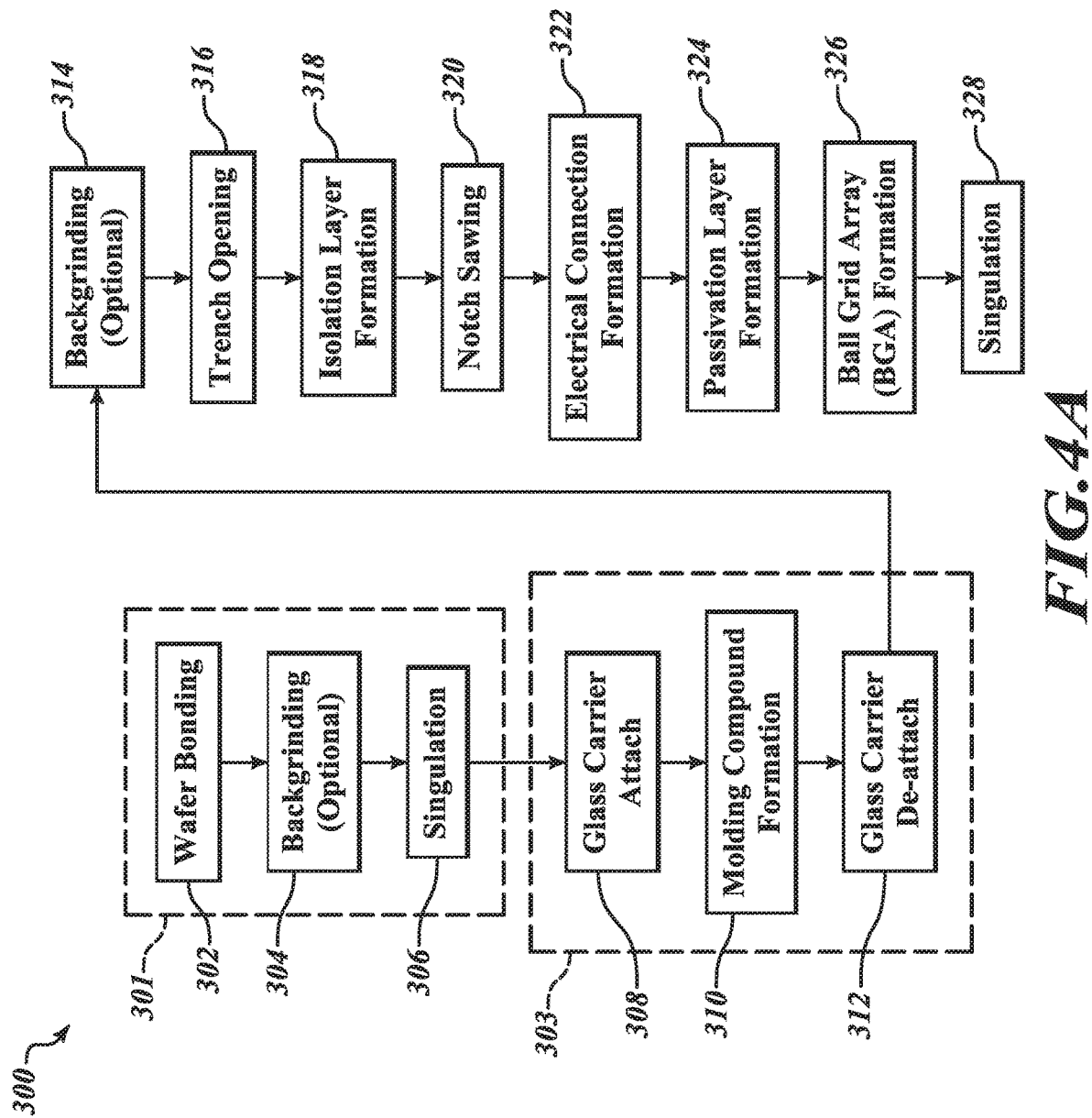
FIG. 4A is a flow-chart of a method of manufacturing an embodiment of a WLCSP, such as the WLCSP shown in FIGS. 1A-1C, in accordance with one or more embodiments.

FIG. 4A is a flow-chart diagram of an embodiment of a method of manufacturing 300 the package 100 as disclosed in the present disclosure and alternative embodiment of WLCSPs. These steps will be discussed in detail with respect to the structures illustrated in FIGS. 4B-4Q. This embodiment of the method of manufacturing 300 is directed to manufacturing the package 100 shown in FIGS. 1A-1C. However, other alternative embodiments, such as the packages 200a, 200b in FIGS. 2 and 3, may be manufactured by adding additional steps to the method 300.

The method 300 includes a wafer preparation process 301 in which a 12-inch wafer is processed and singulated into individual die using steps 302, 304, 306 and a reconstruction and molding process 303 for processing the singulated individual die to form an 8-inch wafer using steps 308, 310, 312. The rest of the steps 314, 316, 318, 320, 322, 324, 326, 328 of the method 300 are further processing steps for forming the package 100.

Figure 4B:
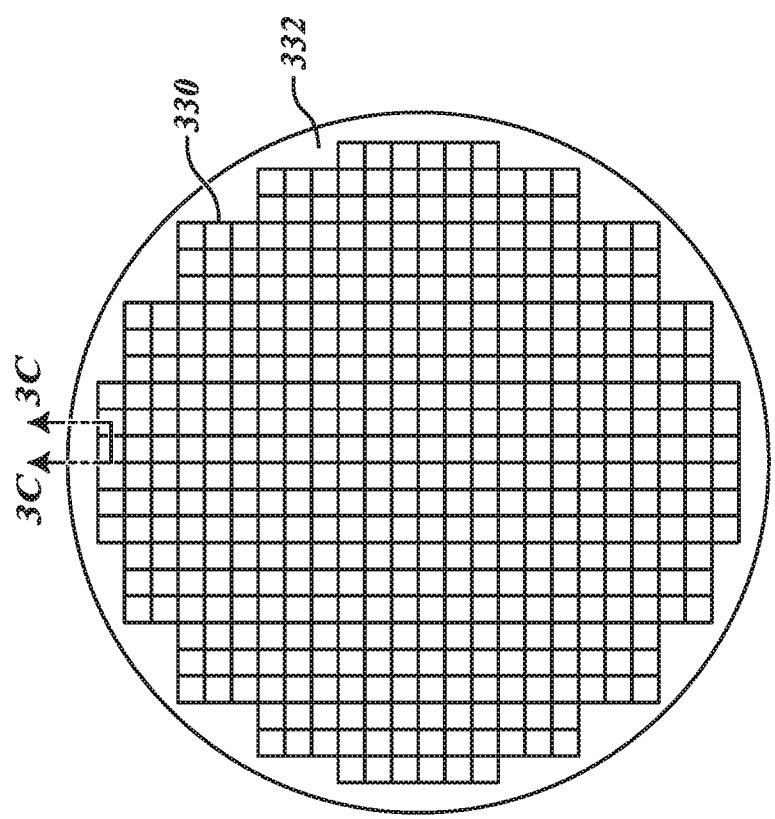
FIGS. 4B-4Q are cross-sectional views of a method of manufacturing the embodiment of the WLCSP, such as the WLCSP shown in FIGS. 1A-1C, as indicated in the flow-chart diagram in FIG. 4A, and in accordance with one or more embodiments.
Figure 4C:
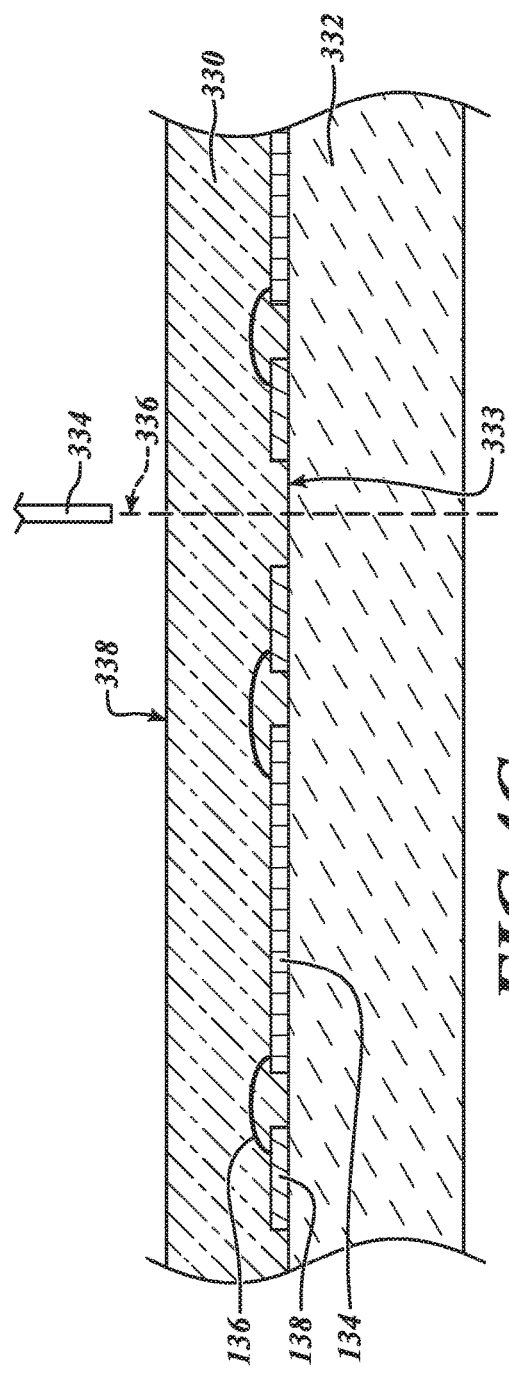

The step 302 of the wafer preparation process 301 of the method 300 is a wafer bonding step 302 in which a semiconductor wafer 330 is coupled to a transparent wafer 332, as shown in FIG. 4B. The semiconductor wafer 330 will have already undergone processing to form electronic circuitry, including the sensor 134 prior to the wafer bonding step 302. The active surface 333 of the semiconductor wafer 330 is coupled to the transparent wafer 332, which can be seen in FIG. 4C. FIG. 4C is a cross-sectional view taken along the line 3C-3C in FIG. 4A. The semiconductor wafer 330 may be a 12-inch wafer, or have other diameters. The transparent wafer 332 may be of any of the transparent materials discussed above for the transparent substrate 110, which will be formed from the transparent wafer 332 as discussed below. The semiconductor wafer 330 may be bonded to the transparent wafer 332 using any of the adhesive materials discussed above with respect to the coupling of the semiconductor die 128 to the transparent substrate 110.

The step 304 of the wafer preparation process 301 is an optional backgrinding step 304 in which, a passive surface 338 of the semiconductor wafer 330, which faces away from the transparent wafer 332 and an active surface 333 of the semiconductor wafer 330, is grinded to reduce the thickness of the semiconductor wafer 330. In step 306 the semiconductor wafer 330 and the transparent wafer 332 are singulated into substrate assemblies 339 as shown in FIGS. 4C and 4D. FIG. 4C illustrates a cutting tool 334 cutting along a dotted line 336 representing the location at which the semiconductor wafer 330 and the transparent wafer 332 are singulated by the cutting tool 334. FIG. 4D illustrates one substrate assembly 339 which includes the transparent substrate 110 and semiconductor die 128 shown in FIG. 1B. The cutting tool 334 may be a laser, a saw, or some other mechanical cutting device or cutting technique as desired.

Figure 4E:
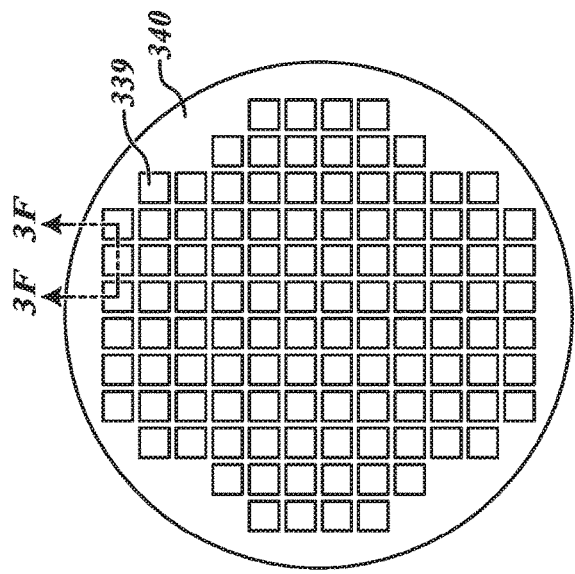
Figure 4D:
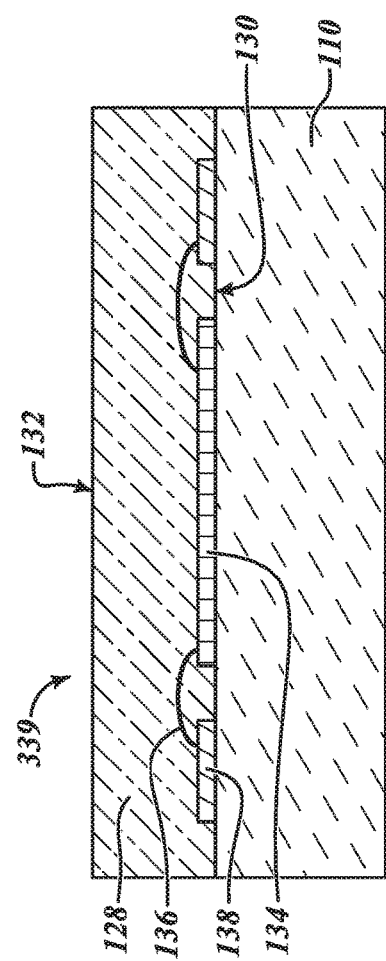
Figure 4H:
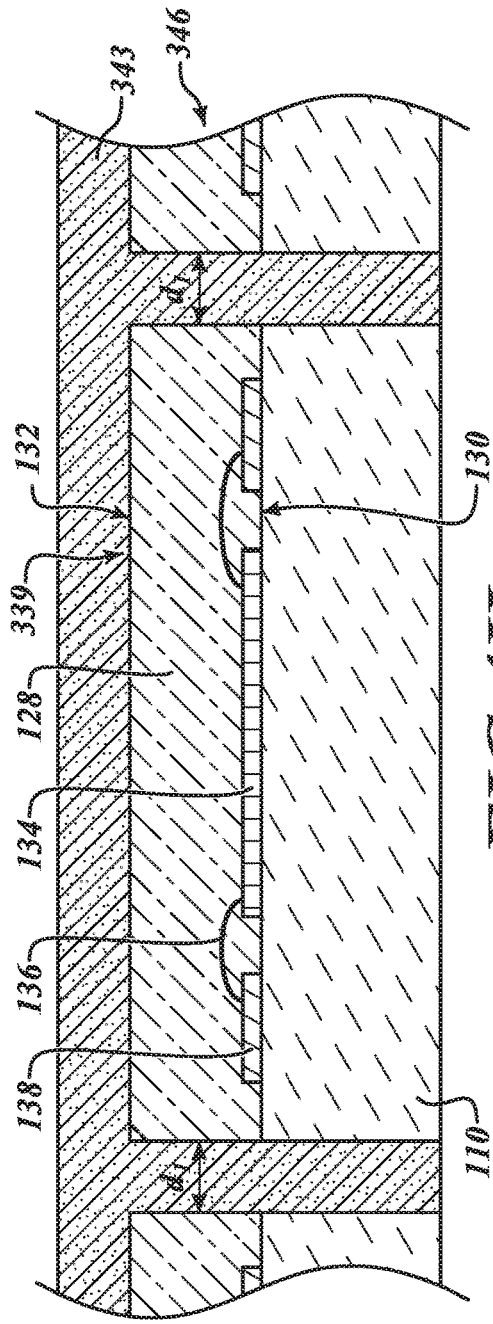

After step 306 in which the semiconductor wafer and the transparent wafer 332 are singulated into substrate assemblies 339, the plurality of transparent substrates 110 are coupled to a carrier support 340 in step 308, which can be seen in FIG. 4E. FIGS. 4F-4H are cross-sectional views taken along line 3F-3F in FIG. 4E.

The carrier support 340 is an 8-inch carrier support in one embodiment, although other sizes may be employed. The carrier support 340 may be a silicon (e.g., glass) carrier substrate, a support wafer, a dummy wafer, or some other support material or carrier support configured to support the plurality of substrate assemblies 339 during further processing. The transparent substrates 110 are coupled to the carrier support 340 by a temporary adhesive material (which is not shown). The temporary adhesive material may be a thermally decomposing adhesive material, a water decomposing adhesive material, a photosensitive decomposing material, or some other adhesive material that can be decomposed or removed without leaving residue on the transparent substrates 110. For the sake of brevity of discussion, the temporary adhesive will be a temporary thermally decomposable adhesive material.

The plurality of substrate assemblies 339 may be positioned on the carrier support 340 by a pick and place machine. The substrate assemblies 339 are spaced apart from each other by a channel 342 of width $d_1$, as shown in FIG. 4F.

After step 308 in which the plurality of substrate assemblies 339 are coupled to the carrier support 340, a molding compound 343 is formed on the plurality of substrate assemblies 339 and the carrier support 340 in step 310, which can be seen in FIG. 4G. The channels 342 between the plurality of dies 128 and the plurality of transparent substrates 110 are filled with the molding compound 343. The molding compound 343 is an opaque material. For example, the opaque material of the molding compound 343 may be a molding compound doped with a black carbon pigment, may be plastic molding compound doped with a black carbon pigment, or may be some other opaque material or combination of opaque materials. The opaque material of the molding compound 343 does not allow for light to pass through it. Once the molding compound 343 is placed in the channels 342, on the plurality of dies 128, on the plurality of transparent substrates 110, and on the carrier support 340, the molding compound 343 is allowed to cure and harden.

After the molding compound 343 is formed, the carrier support 340 is removed or de-attached from the molding compound 343 and the transparent substrates 110 in step 312, which can be seen in FIG. 4H. The carrier support 340 is removed by exposing the carrier support 340 and the temporary thermally decomposable adhesive material coupling the carrier support to the transparent substrates 110 to heat to decompose the temporary thermally decomposable adhesive material. Removing the carrier support 340 leaves a wafer 346 that includes the substrate assemblies 339 and the molding compound 343, which can be seen in the bottom-plan view of FIG. 4I. In some other embodiments, the carrier support 340 itself may be a thermally decomposable material, a light decomposable material, a laser decomposable material, a water decomposable material, or some other type of decomposable material as desired that is decomposed to be removed.

After step 312 in which the carrier support 340 is removed to form the wafer 346, in step 314 the wafer 346 is grinded to remove the molding compound 343 covering the semiconductor dies 128. The grinding of the wafer 346 may also remove portions from the passive surfaces 132 of the dies 128, thereby reducing the thickness of the dies 128. However, in some alternative embodiments, the dies 128 may not be grinded. Grinding the molding compound 343 uncovers the tops of the dies 128 while leaving the molding compound 343 in the channels 342 between the substrate assemblies 339.

Figure 4J:
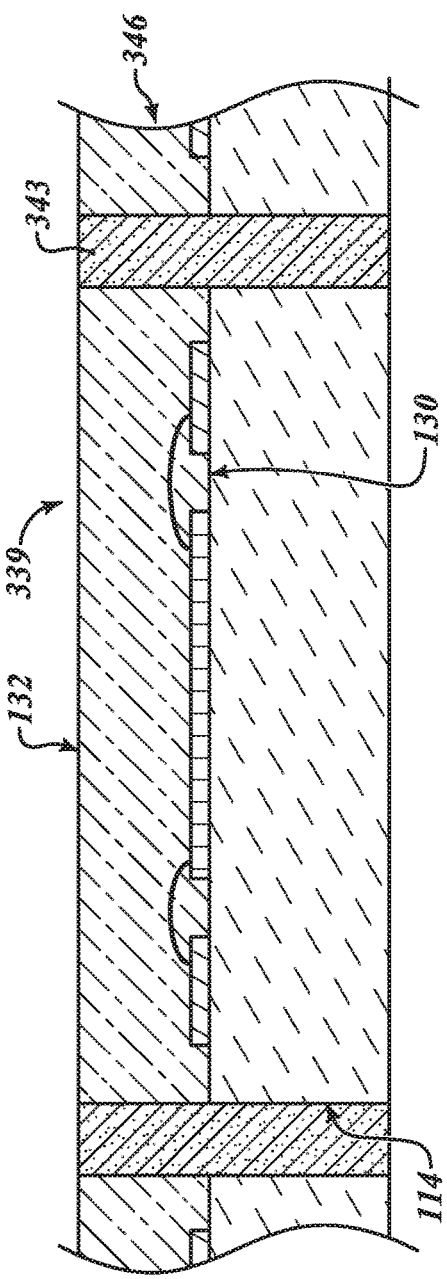
Figure 4I:
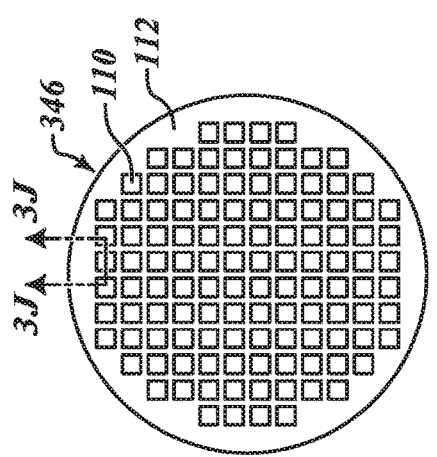

This grinding step 314 may be referred to as a planarizing step because the molding compound 343 and the passive surfaces 132 of the dies 128 are made substantially flush and co-planar with each other, which can be seen in FIG. 4J. This grinding step 314 may be completed by a chemical-mechanical grinding tool, a mechanical grinding tool, or some other grinding tool or planarizing tool or technique to form a substantially flat surface of a wafer.

After step 314 in which the wafer 346 is grinded or planarized, in step 316 a plurality of trenches 350 are formed extending into the wafer 346, which can be seen in FIG. 4K. The plurality of trenches 350 are formed by removing portions of the molding compound 343 between the dies 128 and portions of the dies 128.

The plurality of trenches 350 may be formed by dry etching, wet etching, sawing, cutting, lasering, or some other removal technique. For example, a photolithographic process may be used to define portions of the dies 128 and the molding compound 343 and then a dry etching technique (e.g., plasma etching) is completed to remove the portions of the dies 128 and the molding compound 343.

The dry etching process forms the inclined surfaces 133 of each semiconductor die 128 and exposes surfaces 352 of the contacts 138. These surfaces 352 of the contacts 138 face away from the transparent substrates 110. The first ends 144 of the contacts 138 remain covered by portions 354 of the dies 128 left behind after forming the trenches 350. Each of these portions 354 of each semiconductor die 128 extends from each first end 144 of each contact 138 to the sidewalls 114 of the transparent substrates 110. The molding compound 343 remains positioned between first ends 144 of contacts 138 and the portions 354 of adjacent semiconductor die 128 in the 8-inch wafer 346. The molding compound 343 extends between the sidewalls 114 of the transparent substrates 110.

Each trench 350 extends a first distance $d_2$ from the passive surface of the semiconductor die 128 to the molding compound 343 or the surfaces 352 of each contact 138 exposed by the trenches 350.

After forming the trenches 350, in step 318 the insulating layer 140 is formed, which can be seen in FIG. 4L. The insulating layer 140 is formed on the passive and inclined surfaces 132, 133 of the dies 128, on the surfaces 352 of the contacts 138, and on the molding compound 343 between the transparent substrates 110. The insulating layer 140 partially fills the plurality of trenches 350. The insulating layer 140 may be formed utilizing chemical vapor deposition, physical vapor deposition, sputtering, or some other deposition technique or combination of deposition techniques.

After forming the insulating layer 140, in step 320 the plurality of trenches 350 are extended further into the wafer 346, which can be seen in FIG. 4M. Step 320 may use a sawing tool or other device to remove portions of the transparent substrates 110, portions of the molding compound 343, portions of the contacts 138, the die portions 354, and portions of the insulating layer 140. Step 320 increases the distance $d_2$ of the plurality of trenches 350 extending into the semiconductor die 128. In some alternative embodiments, the distance $d_2$ may remain the same by not removing the portions of the transparent substrate 110 and the die portions 354.

Extending the trenches in step 320 forms an inclined surface 358 of each contact 138 of each semiconductor die 128 and the inclined surfaces 126 of the connecting portions 124 of the transparent substrates 110. The inclined surfaces 126, 358 may be substantially flush or co-planar with each other.

After step 320, step 322 forms the conductive layer 142 directly on the insulating layer 140, the inclined surfaces 358 of the contacts 138, the transparent substrates 110, and on the molding compound 343. The conductive layer 142 may be deposited by utilizing a vapor deposition technique, an electrochemical deposition technique, a sputtering technique, or some other deposition technique or combination of deposition techniques.

After the conductive layer 142 has been deposited, the conductive layer 142 is patterned to form openings 362 through the conductive layer 142 on the insulating layer 140 and openings 364 through the conductive layer 142 within the plurality of trenches 350, as shown in FIG. 4N. The conductive layer 142 may be patterned by using a sawing technique, a cutting technique, a dry etching technique, a wet etching technique, or some other patterning technique or combination of patterning techniques to remove portions of the conductive layer 142. The openings 362, 364 separate portions of the conductive layer 142. The openings 362 in the conductive layer 142 expose portions of the insulating layer 140 and the openings 364 in the plurality of trenches 350 expose the molding compound 343. After step 322 in which the conductive layer 142 is formed, in step 324 the insulating layer 101 is formed in the plurality of trenches 350, which can be seen in FIG. 4O. The insulating layer 101 is formed on the conductive layer 142 that has been patterned, in the openings 362, 364 in the conductive layer 142, on the transparent substrates 110, on the insulating layer 140, and on the molding compound 343. The insulating layer 101 may be deposited utilizing a vapor deposition technique, a chemical deposition technique, a sputtering deposition technique, or some other deposition technique or combination of deposition techniques. The insulating layer 101 may be patterned to form the openings 106 and to expose the plurality of conductive contacts 104, as discussed above.

After forming the insulating layer 101, in step 326 solder balls 366 are formed in the openings 106 and on the plurality of conductive contacts 104, which can be seen in FIG. 4P. The solder balls 366 may be formed by a reflow technique, by an injection technique, or by some other solder ball formation technique or combination of solder ball formation techniques. The solder balls 366 are configured to allow the completed package 100 to be mounted to a PCB or an electronic device. In some other embodiments, the solder balls 366 may be formed on the package 100 after singulation.

Figure 4Q:
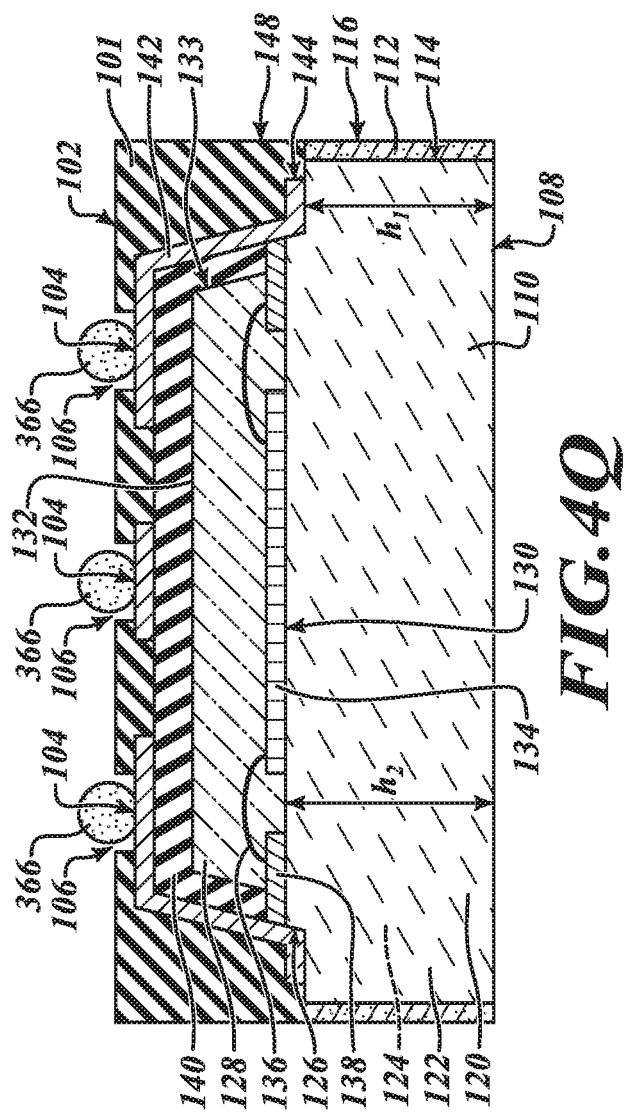

After forming the solder balls 366, in step 328 the wafer 346 after the above processing steps 314-326 is singulated into individual and completed packages 100, which can be seen in FIGS. 4P and 4Q. This singulation step 328 uses a cutting tool 370 to cut through the stacked layers of material at locations indicated by dotted lines 368. The cutting tool 370 may be a saw, a laser, or some other cutting tool or singulation tool as desired. The molding compound 343 between the transparent substrates 110 acts as a buffer by protecting the transparent substrates 110 from the cutting tool 370 during singulation.

The above method may be altered to form the package 200a in FIG. 2 by depositing the layer of material 208a on the 12-inch transparent wafer 332 and coupling the 12-inch wafer 330 to the 12-inch transparent substrate 332. This layer of material 208a allows the cavity 202 to be formed between the die 128 and the transparent substrate 110 of the package 200a. The layer of material 208a may be patterned to form the cavity 202.

The above method may be altered to form the package 200b in FIG. 3 by depositing the multiple layers of material 208b on the 12-inch transparent wafer 332 and coupling the 12-inch wafer 330 to the multiple layers 20b on the 12-inch transparent wafer 332. The multiple layers of material 208b allows the cavity 202 to be formed between the die 128 and the transparent substrate 110 of the package 200b. The multiple layers of material 208b may be patterned to form the cavity 202 or may be deposited in selected areas to form the cavity 202 when forming the package 200b.

Additionally, the above method may be altered to form the package 200b by depositing the insulating layer 204 on the insulating layer 101, in the openings 106, and on the contacts 104 after step 324 and before step 326. After the insulating layer 204 is deposited, the insulating layer 204 is patterned to re-expose the contacts 104. The insulating layer 204 may be patterned using an etch technique, a saw technique, a laser technique, or some other patterning technique or combination of patterning techniques. After the insulating layer 204 is patterned a second conductive layer is deposited on the insulating layer 204 and covers the contacts 104. After the second conductive layer is deposited, the second conductive layer is patterned to form the UBMs 206.

The methods described herein may provide many advantages over prior art methods. For example, coupling the semiconductor dies 128 directly to the transparent substrates 110 makes the packages 100, 200 thinner than prior art packages that utilize a cap and lens arrangement. Many prior art devices employ such a cap to cover and protect a die and a sensor. This increases the overall thickness and lateral size of the package. Accordingly, by coupling the semiconductor die 128 directly to the transparent substrate 110, the overall size of the packages 100, 200 may be made smaller than conventional packages.

The method 300 may create less waste than conventional methods by using leftover substrate assemblies 339, which were formed by singulating the 12-inch wafer 330 and the 12-inch transparent wafer 332, that were not used in forming the first 8-inch wafer 346 in forming an additional second 8-inch wafer.

The method 300 may increase the yield of usable packages 100 due to the molding compound 343 protecting the transparent substrates 110 when the wafer 346 is singulated into packages 100 in step 328. The molding compound, which acts as a buffer, reduces the likelihood of cracking or breaking in the transparent substrates 110 because the transparent substrates 110 are not cut by the cutting tool 370 directly during the singulation step 328. This reduction in likelihood of cracking or breaking in the transparent substrates increases the yield of the number of useable packages 100.

Also, the method 300 may also reduce the overall cost is reduced to manufacture the packages 100 by not requiring new highly specialized machinery. The method 300 can use existing highly specialized machinery that is only capable of working with 8-inch wafers because the substrate assemblies 339, which may be formed from 12-inch wafers and placed on 8-inch carriers 340. In some other embodiments of a method, an 12-inch wafer may be converted to another 12-inch wafer, an 8-inch wafer may be converted to a 12-inch wafer, an 8-inch wafer may be converted to another 8-inch wafer, or any sized wafer may be converted to another sized wafer as desired.

The various embodiments described above can be combined to provide further embodiments. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a transparent substrate including a first surface, a second surface opposite to the first surface in a direction directed from the first surface towards the second surface, and sidewalls transverse to the first surface and the second surface;
   a molding compound on the sidewalls of the transparent substrate;

a die on the second surface of the transparent substrate, the die including:
  a sensor aligned with the transparent substrate;
  a contact that extends outward from an edge of the die and away from the sensor in a transverse direction transverse to the direction; and
  an electrical connection having a first end coupled to the sensor and a second end coupled to the contact;
a first insulating layer on the die and on the contact of the die; and
a conductive layer on the first insulating layer, the conductive layer including:
  a first end portion on the first insulating layer; and
  a transverse portion on the first insulating layer, the transverse portion is transverse to the first end portion, is transverse to the contact, and is coupled to the contact.

2. The device of claim 1, further comprising:
a second insulating layer on the first insulating layer, the conductive layer, and the molding compound; and
an opening in the second insulating layer, the opening exposing a portion of the conductive layer, and
wherein the conductive layer further includes a second end portion transverse to the transverse portion and is closer to the second surface of the transparent substrate portion than the contact of the die.

3. The device of claim 2, wherein the molding compound has a surface substantially flush with a surface of the second insulating layer.

4. The device of claim 1, further comprising:
a cavity between the die and the transparent substrate, the cavity being adjacent to the sensor of the die; and
a nonconductive layer on the transparent substrate and between the contact of the die and the transparent substrate.

5. The device of claim 4, wherein a surface of an end of the nonconductive layer is substantially flush with a surface of the molding compound.

6. The device of claim 1, wherein the molding compound is an opaque material.

7. The device of claim 1, wherein:
the transparent substrate has a central portion having a first height extending in the direction;
the sidewalls have a second height less than the first height of the central portion of the transparent substrate, the second height extending in the direction; and
the die is on the central portion of the transparent substrate.

8. A device, comprising:
a transparent substrate including:
  a center;
  a first surface;
  a second surface opposite the first surface;
  a central portion at the center, the central portion having a first height extending from the first surface to the second surface in a direction directed from the first surface to the second surface; and
  a peripheral region surrounding the central portion, the peripheral portion including sidewalls transverse to the first surface and the second surface, the sidewalls having a second height extending in the direction directed from the first surface to the second surface of the transparent substrate, the second height being less than the first height;
a molding compound on the sidewalls of the transparent substrate, the molding compound having the second height; and
a semiconductor die on the transparent substrate, the semiconductor die including a conductive contact on the transparent substrate that extends outward from an edge of the semiconductor die.

9. The device of claim 8, wherein the transparent substrate further
comprises a connecting portion that surrounds the central portion, the connecting portion connects the central portion to the peripheral portion and has a third height in the direction, and the third height varies between the first height and the second height.

10. The device of claim 9, wherein the first surface of the transparent substrate further comprises a surface of the central portion, a surface of the peripheral portion surrounding the surface of the central portion, and a surface of the connecting portion connecting the surface of the peripheral portion to the surface of the central portion.

11. The device of claim 10, wherein the surface of the connecting portion of the first surface of the transparent substrate portion is an inclined surface.

12. A method, comprising:
coupling a semiconductor wafer to a first surface of a transparent wafer;
singulating the semiconductor wafer and the transparent wafer forming a plurality of substrate assemblies, each substrate assembly including a transparent substrate and a semiconductor die coupled to each other;
coupling the plurality of substrate assemblies to a carrier support;
forming a molding compound on the plurality of substrate assemblies and the carrier support;
decoupling the carrier support from the plurality of substrate assemblies and the molding compound;
forming a plurality of trenches in the plurality of substrate assemblies and in the molding compound;
forming a first insulating layer on the plurality of substrate assemblies and the molding compound;
extending the plurality of trenches further into the plurality of substrate assemblies, into the molding compound, and into the first insulating layer;
forming a conductive layer with an end closer to a second surface of the transparent wafer opposite to the first surface of the transparent wafer than contacts of the substrate assemblies, on the first insulating layer, on contacts of each of the substrate assemblies, and into the first insulating layer; and
forming a plurality of packages by singulating the plurality of substrate assemblies and the molding compound.

13. The method of claim 12, further
comprising forming a second insulating layer in the trenches and on the conductive layer.

14. The method of claim 13, wherein extending the plurality of trenches further comprises removing portions of electrical contacts of each of the semiconductor die of the plurality of substrate assemblies.

15. The method of claim 12, wherein the semiconductor wafer and the transparent wafer are 12-inch wafers, and the carrier support is an 8-inch glass carrier substrate.

16. The method of claim 15, further comprises forming an 8-inch wafer by forming the molding compound and decoupling the carrier support from the molding compound and the plurality of substrate assemblies.

17. The method of claim 12, wherein forming the plurality of packages by singulating the plurality of substrate assemblies and the molding compound further comprises forming a layer of the molding compound on sidewalls of each of the transparent substrates of the plurality of substrate assemblies.

18. The method of claim 12, extending the plurality of trenches further into the plurality of substrate assemblies and the molding compound further comprises forming a raised portion of each of the transparent substrates of the plurality of substrate assemblies.

19. The method of claim 12, further comprising planarizing the molding compound and the plurality of substrate assemblies forming a surface of the molding compound flush with surfaces of each of the semiconductor dies of the plurality of substrate assemblies.

20. The method of claim 12, wherein:
 coupling the plurality of substrate assemblies to the carrier support further comprises spacing each of the substrate assemblies apart from each other; and
 forming the molding compound includes forming the molding compound between the substrate assemblies.

* * * * *